United States Patent [19]
Proebsting

[11] Patent Number: 6,134,176
[45] Date of Patent: Oct. 17, 2000

[54] DISABLING A DEFECTIVE ELEMENT IN AN INTEGRATED CIRCUIT DEVICE HAVING REDUNDANT ELEMENTS

[76] Inventor: Robert J. Proebsting, 13737 Wallace Pl., Morgan Hill, Calif. 95037

[21] Appl. No.: 09/199,884

[22] Filed: Nov. 24, 1998

[51] Int. Cl.⁷ .................................................. G11C 8/00
[52] U.S. Cl. ..................... 365/230.06; 365/200; 365/154
[58] Field of Search ............................... 365/200, 230.06, 365/154, 205

[56] References Cited

U.S. PATENT DOCUMENTS

| | | | |
|---|---|---|---|
| 4,547,867 | 10/1985 | Reese et al. ............................... | 365/189 |
| 4,573,146 | 2/1986 | Graham et al. ........................... | 365/200 |
| 4,723,227 | 2/1988 | Murotani .................................. | 365/200 |
| 4,918,662 | 4/1990 | Kondo ...................................... | 365/210 |
| 4,922,134 | 5/1990 | Hoffmann et al. ....................... | 307/441 |
| 5,134,583 | 7/1992 | Matsuo et al. ........................... | 365/200 |
| 5,343,429 | 8/1994 | Nakayama et al. ...................... | 365/200 |
| 5,345,110 | 9/1994 | Renfro et al. ......................... | 307/272.3 |
| 5,566,128 | 10/1996 | Magome ............................. | 365/230.06 |
| 5,572,471 | 11/1996 | Proebsting .............................. | 365/200 |
| 5,576,999 | 11/1996 | Kim et al. ................................ | 365/200 |

*Primary Examiner*—David Nelms
*Assistant Examiner*—Thong Le
*Attorney, Agent, or Firm*—Skjerven Morrill MacPherson Franklin & Friel

[57] ABSTRACT

A circuit and method are provided for disabling a defective normal element using a flip-flop. The flip-flop has two states. In a first state, the flip-flop enables a normal decoder, corresponding to the normal element, to respond to a respective address for the normal element. In a second state, the flip-flop disables the normal decoder from responding to any address.

39 Claims, 2 Drawing Sheets

DISABLING A DEFECTIVE ELEMENT IN AN INTEGRATED CIRCUIT DEVICE HAVING REDUNDANT ELEMENTS

FIELD OF THE INVENTION

The present invention relates generally to the field of semiconductor integrated circuits, and more particularly, to disabling a defective element in an integrated circuit device having redundant elements.

BACKGROUND OF THE INVENTION

Integrated circuit (IC) memory devices store large amounts of data in relatively small physical packages. Typically, an IC memory device comprises a plurality of cells arranged in a matrix of rows and columns. Separate bits of data may be written into, stored, and read out of each of these memory cells.

According to known techniques, redundant (spare) rows and/or columns can be incorporated into IC memory devices to replace defective elements. This allows an otherwise defective memory device to be repaired rather than scrapped, thereby improving the yield and decreasing the cost of manufacture.

In a typical redundancy scheme, if a "normal" element (e.g., row or column) is defective, a comparable redundant element is "enabled" by programming the redundant element to respond to the address of the defective normal element. In addition, the defective element is disabled to prevent it from interfering with the operation of the respective redundant element which replaces it. Both normal elements and redundant elements are selected with corresponding decoders, each of which is responsive to a particular address.

Various techniques have previously been developed to disable defective elements. According to one such technique, a fuse is provided for every normal element or group of normal elements in a memory device. Each fuse can be selectively blown, for example, with a properly aimed burst of light from a LASER, in order to disable the respective element or group of elements. This technique of using fuses is problematic in that fuses generally require large amounts of surface area to implement. Furthermore, each fuse must be on the pitch (row to row spacing) of the memory cells which are supported. While the rows on a modern memory device (e.g., a modern dynamic random access memory (DRAM)) are on a pitch of less than one-half micron, fuses are on a minimum pitch of many microns. To compensate for this difference in pitch between rows and fuses, many rows may be grouped, and accordingly, disabled, together. Thus, when a single row is defective, it along with perhaps seven other rows are all replaced, even if the seven other rows are not defective. This is very inefficient, requires large amounts of additional chip area, and increases the cost of manufacture.

Another technique uses logic circuitry to de-select a defective normal element when a redundant element is selected as a replacement. In this technique, whenever any redundant element is selected (i.e., its programmed address is present at the corresponding redundant decoder), a buffered output from the selected redundant decoder drives an extra input on each of a large number of normal decoders to disable these normal decoders. During operation, upon receipt of the address of the defective element, the normal decoder for the defective normal element initially responds to its corresponding address and then shuts off when it subsequently receives the buffered redundant select signal indicating that the redundant element has also been selected. This creates extra delay between the time that the normal and redundant decoders are first selected and the time that the normal decoder is logically deselected. Such delay can be as high as ten percent (10%) of the total access time for a memory device. Thus, this technique for disabling a defective element adversely affects the performance of the memory device.

Yet another technique for disabling a defective normal element requires two separate decoders—a main decoder and a direct current (DC) decoder—for each normal element. For a particular normal element, the main decoder receives and conditionally responds to the address input to the chip. After programming a redundant element, its DC address bus always contains the address of the defective element. The respective DC decoder then permanently disables its normal decoder. To accomplish this, a separate DC address bus must be provided for each redundant element. Also, separate DC decoders must be provided for each normal element for each DC address bus. The buses for the DC decoders and DC decoders themselves, however, can consume significant chip area, especially when numerous redundant elements are provided. Such use of area increases the cost of each chip.

SUMMARY OF THE INVENTION

The disadvantages and problems associated with disabling a defective element in a memory device have been substantially reduced or eliminated using the present invention.

In accordance with an embodiment of the present invention, a memory array includes a number of normal elements and redundant elements. Each normal element or group of normal elements can be selected by a respective normal decoder, and each redundant element or group of redundant elements can be selected by a respective programmable redundant decoder. A flip-flop is coupled to the respective normal decoder for each normal element(s). Initially, each flip-flop is set so that it allows the corresponding normal decoder to respond to its respective address. When a particular normal element is found to be defective, one of the redundant decoders is permanently programmed with the particular address of the defective normal element. Such decoder will now enable the redundant element whenever this address occurs. Furthermore, the output signals of all redundant decoders are logically ORed together to generate a "redundant select" signal. This common signal is separately ANDed with the output signal of each normal decoder. Each resultant AND signal, when asserted, will reset the flip-flop associated with its normal decoder. In particular, if one of the redundant decoders has been programmed with the address of a defective normal element, the AND signal resulting from the simultaneous selection of the normal decoder for the defective element and the redundant decoder for the redundant element resets the flip-flop coupled to such normal decoder the first time that address occurs. Once reset, such flip-flop disables the corresponding normal decoder for so long as the chip remains powered so that the respective normal element, which is defective, cannot again be selected, even momentarily.

In any read-write memory device, data must be written before it can be read. Therefore, the first time an element (normal or redundant) is selected, it is for the purpose of writing data, not for reading data. In many such memory devices, including most static random access memories (SRAMs), writing to a selected redundant element is not compromised if the defective normal element being replaced is also selected on the first write cycle. Data is properly written to the redundant element, and may or may not be written to the defective normal element. In one embodiment, when the present invention is incorporated into a memory device where writing into a redundant element is not compromised if the defective element and the normal element are both selected, a flip-flop corresponding to a defective normal element is reset on the first (write) cycle to the defective element. The defective normal element is thus disabled for any subsequent read or write cycle. Accordingly, on the first read cycle, proper reading occurs because only the redundant element replacing the defective normal element is selected at that time.

In other memory devices, writing to a redundant element may be compromised if a defective normal element is permitted to be selected on the first write cycle. An example of such a device is dynamic random access memory (DRAM) in which a selected normal element (word line) is driven to an internally generated voltage having a value greater than the supply voltage. In this case, if a defective normal element happens to be a word line shorted to ground, any attempt to select the shorted word line (for reading or writing) will temporarily short out the high internally generated voltage supply, thereby preventing a redundant word line, using the same supply, from reaching its normal operating voltage. Thus, writing on a first cycle may not be successful. To address this problem, according to another embodiment of the present invention, an initialization or power-up sequence cycles through the respective addresses for all normal elements. During this sequence, the addresses are presented sequentially. At this time, provision is made in the preferred embodiment to select a single decoder in all arrays simultaneously and furthermore to disable the output of each normal and redundant decoder even though an internal node in each decoder responds to the respective address. This allows the flip-flops associated with defective elements to be reset without actually enabling the defective elements. During this sequence, whenever a redundant element responds to an address, the flip-flop associated with the defective normal element at that address is permanently reset. Thus, after the power-up sequence, the normal decoders for the defective normal elements do not again respond to the respective address. Accordingly, the first write cycle to an address for a defective normal element works properly because only the redundant element which replaces the defective element is able to respond to that address.

A technical advantage of the present invention includes providing, in a memory device, one or more flip-flops for disabling respective normal elements. These flip-flops and associated circuitry are relatively small. With the flip-flops, fuses are not needed to "de-program" any defective normal elements. In addition, the flip-flops and associated circuitry do not require a significant amount of extra wiring for support. Accordingly, the present invention can be implemented in a relatively small amount of chip area and avoids complex wiring schemes. Furthermore, disabling of a defective normal element with a flip-flop avoids the delayed deselection characteristic of some prior art techniques.

Another technical advantage of the present invention includes preventing both the respective normal element and the respective redundant element from turning on during the initialization address sequencing when the above-described flip-flops are being reset. The normal and redundant decoders for each element can still function, but the elements themselves are disabled at this time. In this way, the elements do not consume power during initialization. Thus, in one embodiment, when an integrated circuit memory device comprises multiple arrays, each array having a plurality of elements and corresponding decoders, the present invention allows many decoders to be addressed simultaneously during the initialization cycle, one from each separate array. Multiple selection during initialization decreases the number of initialization cycles required.

Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

As described herein, the present invention provides a technique for disabling defective normal elements in a memory device, thereby preventing such defective elements from interfering with the operation of the memory device. This technique can be implemented in a relatively small surface space without significantly slowing the operation of the memory device. The preferred embodiments of the present invention and their advantages are best understood by referring to FIG. 1 of the drawings.

Figure 1A:
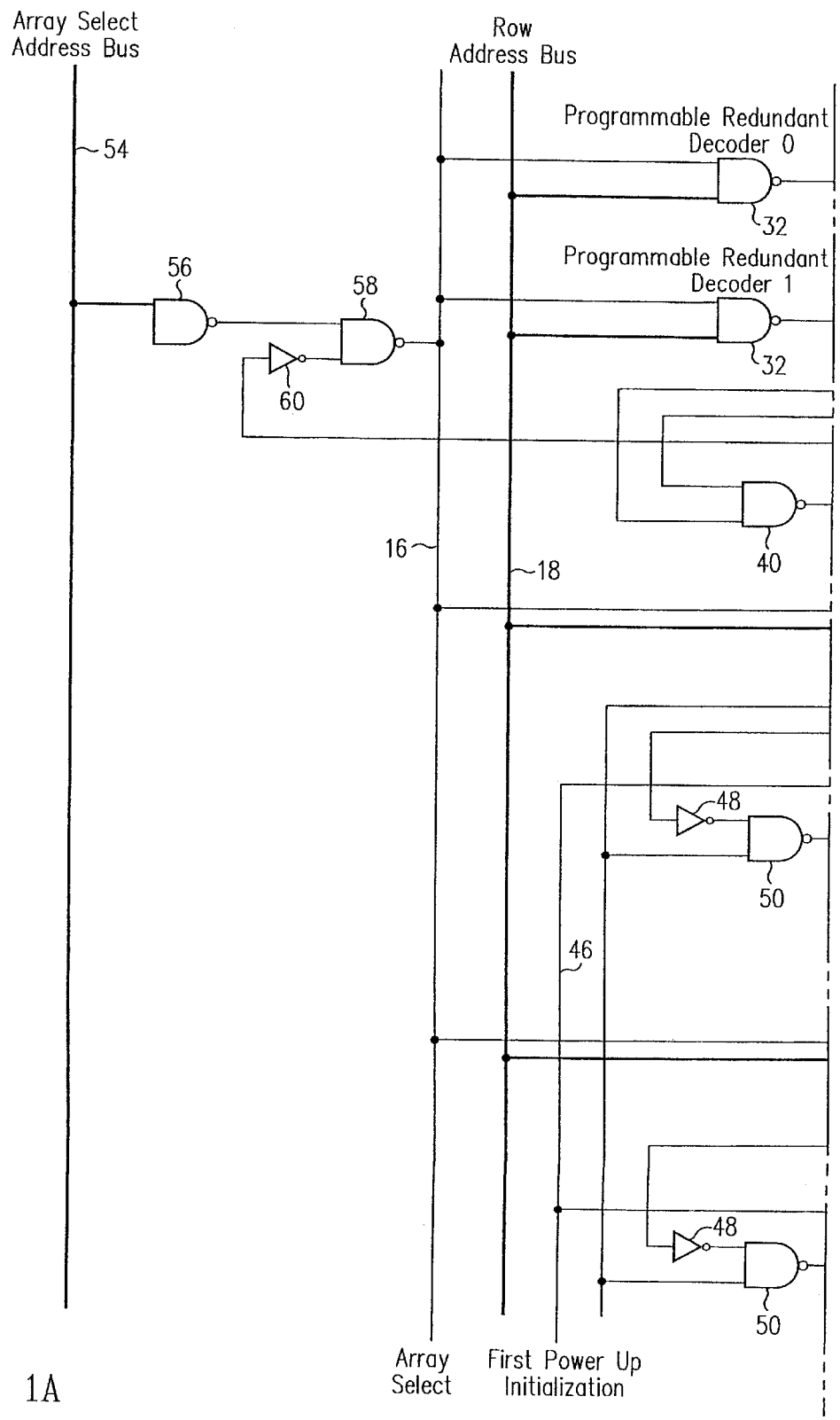
FIG. 1 is a block diagram of an exemplary circuit for implementing a redundancy scheme in an integrated circuit device, in accordance with an embodiment of the present invention.
Figure 1B:
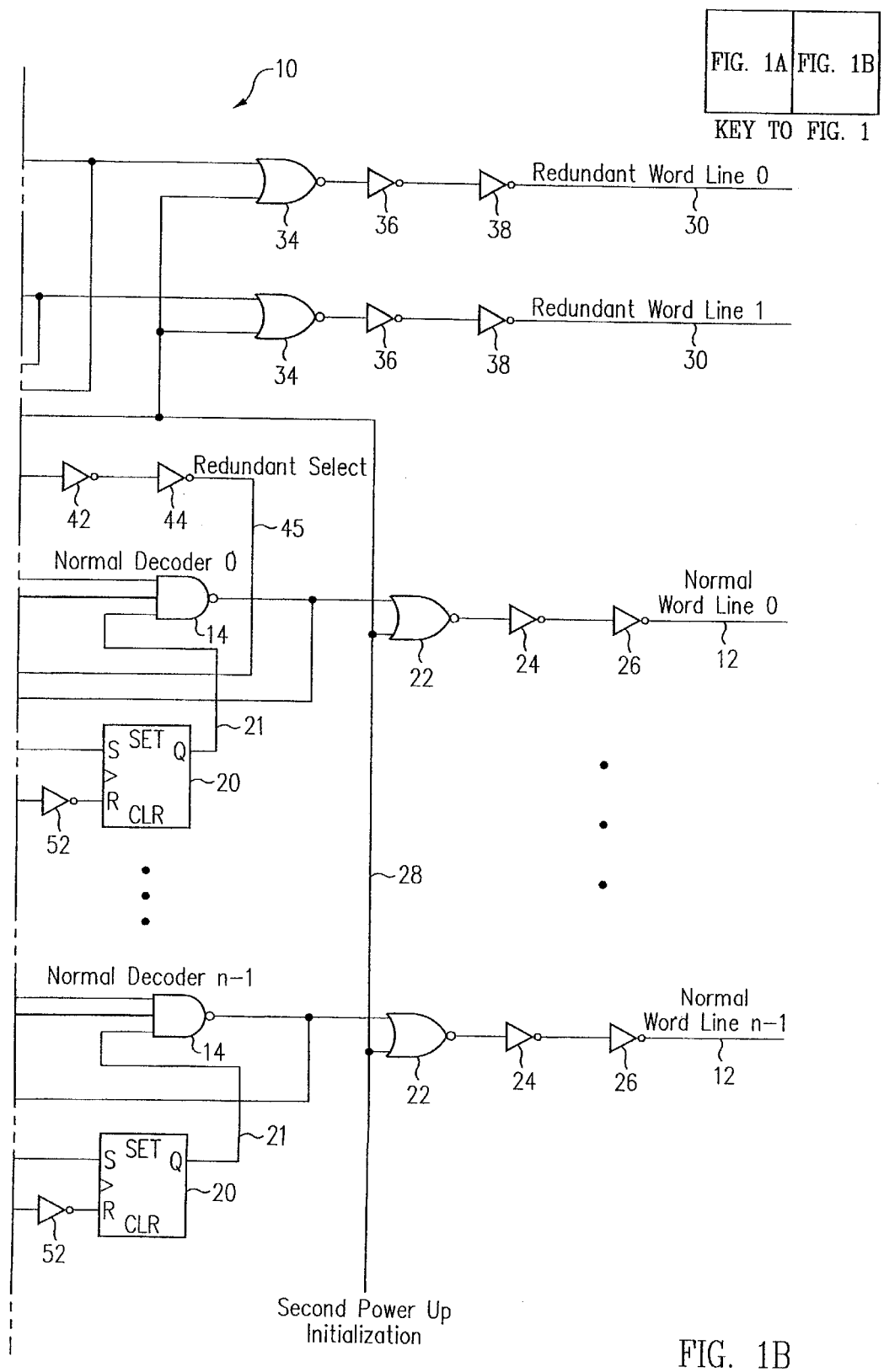

FIG. 1 is a block diagram of an exemplary circuit 10 for implementing a redundancy scheme in an integrated circuit device, in accordance with an embodiment of the present invention. In general, this redundancy scheme allows a defective element, such as a row or a column, to be permanently disabled after power up. Furthermore, the scheme can be implemented in a relatively small surface area, thereby avoiding the problems associated with previously developed techniques. Although the following describes this redundancy scheme primarily in the context of rows of memory cells which are accessible by respective word lines, it should be understood that the invention is not so limited. Rather, the redundancy scheme can be applied or utilized with any element which is capable of being replaced/substituted in an IC device. Thus, for example, the redundancy scheme is applicable to columns of memory cells which are accessible by respective bit lines.

Circuitry for Normal Elements

Circuit 10 includes n number of normal word lines 12 which, as depicted, are labeled "Normal Word Line 0" through "Normal Word Line n−1." n is an integer representing the total number of normal word lines in each array. Normal word lines 12 provide access into respective rows of memory cells (not shown). Specifically, each normal word line 12 is identified by a particular row or word line address which, when decoded, "enables" the word line so that information can be written into or read out of the corresponding memory cells.

Normal word lines 12 (and, hence, the respective rows of memory cells) are often grouped into a plurality of separate memory arrays. Each array of normal word lines 12 can be identified by a particular array address which allows the array to be selected. Besides the array of word lines 12 shown in FIG. 1, the IC device into which circuit 10 is incorporated may include a plurality of other arrays of word lines, with every other array also capable of being selected by a respective array address.

A number of normal decoders 14, labeled "Normal Decoder 0" through "Normal Decoder n−1," are coupled to normal word lines 12. As used herein, the terms "coupled," "connected," or any variant thereof, means any coupling or connection, either direct or indirect, between two or more elements. In one embodiment, as shown, a separate normal decoder 14 is provided for each normal word line 12. Each normal decoder 14 functions to select or enable the respective normal word line 12, for example, by outputting a low value signal (i.e., "select low"), as depicted. Each normal decoder 14 may, for example, comprise a NAND gate.

An input lead to each normal decoder 14 is coupled to an array select line 16 and an input bus to each decoder 14 is coupled to a row address bus 18 for receiving an array select signal and a row address signal, respectively. During normal read or write operations, the array select and row address signals identify the location to be read or to be written. The array select signal allows the selection of a selected one of the many arrays, each array having many normal word lines 12 and a few redundant word lines 30. During a power up sequence if required, all possible row addresses can be generated by an oscillator and a row address counter (not shown). If the IC device is a DRAM with an internal refresh address counter, the refresh counter can be used to generate sequentially each possible row address. The row address signal provides the addresses for particular normal word lines 12 or programmable redundant word lines 30 to be enabled. That is, each normal decoder 14 can be hard-wired programmed for a specific row address coming from row address bus 18. For example, Normal Decoder 0 can be programmed for the address "000 . . . 000," while Normal Decoder n−1 can be programmed for the address Each normal decoder 14 may also receive on a corresponding input lead an enable signal 21 from a respective flip-flop 20, as described below in more detail. This signal, when asserted high, allows normal operation of the decoder. The same signal, when low, serves to disable (e.g., hold low) the respective normal word line 12 by holding high the output signal from the corresponding decoder 14.

Coupled in series between the output lead of each normal decoder 14 and its respective normal word line 12 is a NOR gate 22, an inverter 24, and another inverter 26. Each NOR gate 22 has two input leads: one for receiving the output signal of the respective normal decoder 14 and another for receiving a second power-up initialization signal (from a second power-up initialization line 28). During normal operation, the second power up initialization signal is low and NOR gate 22 functions as an inverter. During an initialization period for circuit 10, the second power up initialization signal is high and NOR gate 22 functions to prevent the respective normal word line 12 from turning on. Inverters 24 and 26 buffer the output signal of NOR gate 22 to drive the high capacitance of the word line and cause the signal on the respective normal word line 12 to go "high" or "low." Normal word line 12 is enabled when high and is disabled when low.

Circuitry for Redundant Elements

A number of redundant word lines 30 are also provided in circuit 10. Although the depicted embodiment shows two redundant word lines 30, labeled as "Redundant Word Line 0" and "Redundant Word Line 1," it should be understood that any suitable number of redundant word lines 30 can be provided. Each redundant word line 30 can be substituted for, or used to replace, any one of normal word lines 12 in its array. In a preferred embodiment, replacement is made on an individual basis. That is, if a single normal word line 12 is defective, only that word line 12 is replaced with a redundant word line 30. The specific example shown in FIG. 1 replaces word lines 30 on an individual basis.

In another embodiment, for pitch reasons, replacement is made on a group basis, wherein all members in a group share a single flip-flop. Specifically, normal word lines 12 and redundant word lines 30 are divided into groups, each group comprising two or more adjacent word lines. If a single normal word line 12 in a particular group is defective, that normal word line 12 along with all other normal word lines 12 in that group are replaced with the same-sized group of redundant word lines 30. In this case, a single flip-flop disables the entire group (containing at least one defective normal element). Each redundant word line 30, when enabled, allows access to its memory cells to substitute for those of the defective normal word line 12 which it replaces.

If replacement is made on an individual basis, a separate programmable redundant decoder 32 is coupled to each redundant word line 30. As shown, these programmable redundant decoders 32 are labeled "Programmable Redundant Decoder 0" and "Programmable Redundant Decoder 1." Each programmable redundant decoder 32 can be programmed to enable the respective redundant word line 30 in response to the address of any defective normal word line 12. In this way, if a normal word line 12 is defective, the redundant word line 30 can act as a substitute for the same. Techniques for programming redundant decoders are generally well-known to those in the art. An input lead to each of programmable redundant decoders 32 is coupled to array select line 16 and an input bus to each of decoders 32 is coupled to row address bus 18 for receiving the array select and row address signals, respectively. Each programmable row decoder 32 may, for example, comprise a NAND gate having row address inputs programmably connected to the appropriate signals in the row address bus 18.

A NOR gate 34, an inverter 36, and another inverter 38 are coupled in series between each programmable redundant decoder 32 and the respective redundant word line 30. Each NOR gate 34 has two input leads, one for receiving the output signal from the respective programmable redundant decoder 32 and the other for receiving the second power-up initialization signal. Inverters 36 and 38 receive and buffer the output signal of the respective NOR gate 34. This causes the signal on the corresponding redundant word line 30 to go "high" or "low," thereby enabling or disabling, respectively, such redundant word line 30.

Redundant Select Circuitry

A NAND gate 40 has a plurality of input leads, with each input lead receiving the output signal of one of programmable redundant decoders 32. Inverters 42 and 44 are coupled in series to the output lead of NAND gate 40 to buffer the output signal on this lead.

Series connected NAND gate 40, inverter 42, and inverter 44, taken together, constitute redundant select circuitry which outputs a redundant select signal on a line 45. A high value for such redundant select signal is generated whenever one of programmable redundant decoders 32 is enabled (low output) to replace a defective normal word line 12. Accordingly, the series connected NAND gate 40 and inverters 42 and 44 perform a logical OR operation to "turn on" the redundant select signal whenever one or another of redundant decoders 32 is enabled. In a preferred embodiment, the redundant select signal is a unique signal for each array.

Flip-flops

A separate flip-flop 20 is coupled to one input lead of each normal decoder 14. As shown, each flip-flop 20 may comprise a set-reset (SR) flip-flop having a set (S) input, a reset (R) input, and a Q output. The Q output signal of each flip-flop 20 is input into its respective normal decoder 14. The S input lead of each flip-flop 20 receives a first power-up initialization signal carried over a line 46.

Each flip-flop 20 generally functions to permanently disable its (at least one) respective normal word line 12 when such normal word line 12 has been replaced with a redundant word line 30. Specifically, each flip-flop 20 has two states: a first state which allows a normal decoder 14 to respond to the respective address, thereby enabling a corresponding normal word line 12, and a second state which prevents the normal decoder 14 from responding to any address, thereby disabling the corresponding normal word line 12. Provision is made to initially set all flip-flops 20 to the first state. In this first state, normal decoders 14 operate normally. On the other hand, with particular reference to the depicted embodiment, if a flip-flop 20 has been reset, its Q output lead is permanently low, thus keeping the signal on one input lead of the respective normal decoder 14 (which is a NAND gate) low. This maintains a high output on NAND gate 14, and a low output on NOR gate 22. Thus, the respective normal word line 12 cannot be enabled (i.e., cannot receive a high signal). Although FIG. 1 depicts an embodiment where each flip-flop 20 supports (i.e., enables and disables) but a single normal element, it should be understood that in alternative embodiments each flip-flop 20 may support a plurality of normal elements.

Reset Circuitry

Coupled to the R input lead of each flip-flop 20 is the series combination of a respective inverter 48, a NAND gate 50, and an inverter 52. Each inverter 48 receives the select low output signal from its respective normal decoder 14. The respective NAND gate 50 has input leads which receive the select high output signal of inverter 48 and the redundant select signal from inverter 44. Each inverter 52 inverts the output signal from the respective NAND gate 50. The output signal of each inverter 52 is received at the R input lead of the respective flip-flop 20.

Collectively, series connected inverter 48, NAND gate 50, and inverter 52 constitute reset circuitry which outputs a reset signal. The reset signal resets the flip-flop 20 to the second state upon the first occurrence of the respective normal decoder 14 responding to its hard-wired address and any programmable redundant decoder 32 in the same array (which has been programmed to respond to the same address) also responding. Thus, the selection of a redundant element at any address prevents further selection of the normal element that would otherwise respond to that address. The defective normal element is thereafter permanently disabled.

Array Select Circuitry

An array select address bus 54 carries an array select address signal which functions to select one or more memory arrays, for example, among the large plurality of memory arrays in a typical memory device. A NAND gate 56 receives the array select address signal from bus 54. NAND gate 56 functions as a hard-wired decoder programmed to the address for this array.

A NAND gate 58 receives the output signal of NAND gate 56 at one input lead. NAND gate 58 generates the array select signal which is output on array select line 16. During normal operation, the second power up initialization signal is low, the output of an inverter 60 is high, and NAND gate 58 operates as an inverter. When this array is selected in normal operation, NAND gate 56 outputs a low value to NAND gate 58, thus causing NAND gate 58 to output a high value to each normal decoder 14 and programmable redundant decoder 32 in that array.

Inverter 60 is coupled to another input lead of NAND gate 58. Inverter 60 receives and inverts the second power-up initialization signal. During the power up sequence when the second power-up initialization signal is high, inverter 60 outputs a low value to NAND gate 58, which causes NAND gate 58 to output a high value to each normal decoder 14 and programmable redundant decoder 32 in every array simultaneously. Thus, the normal and redundant decoders can be enabled when either this array is specifically selected in normal operation or when all arrays are selected by the assertion of a high value for second power-up initialization signal. Furthermore, while programmable redundant decoders 32 and normal decoders 14 are enabled in all arrays, the word lines themselves are all disabled by the high value for the second power-up initialization signal input to NOR gates 34 and 22.

Operation—General

Circuit 10 can be operated in different ways, depending upon the type of memory device into which it is incorporated. In any read-write memory device, data must be written before it can be read. Therefore, the first time an element (normal or redundant) is selected, it is for the purpose of writing data, not for reading data. In many such memory devices, including most static random access memories (SRAMs), writing to a selected redundant element is not compromised if the defective normal element being replaced is also selected on the first write cycle or during a portion of the first cycle. Data is properly written to the redundant element, and may or may not be written to the defective normal element. In such memory devices, the second power-up initialization signal (line 28) is not required, inverter 60 is not required, NOR gates 22 and 34 can be replaced by inverters, and NAND gates 58 can be replaced by inverters. In such devices, no special power-up sequence is required other than to initially set all flip-flops 20.

In other memory devices, writing to a redundant element may be compromised if a defective normal element is permitted to be selected on the first write cycle. An example of such a device is dynamic random access memory (DRAM) in which a selected normal element (word line) is driven to an internally generated voltage having a value greater than the supply voltage—i.e., "boot-strapping." In this case, if a defective normal element happens to be a word line shorted to ground, any attempt to select the shorted word line (for reading or writing) will temporarily short out the high internally generated voltage supply, thereby preventing a redundant word line, using the same internally generated voltage supply, from achieving its proper operating voltage. Thus, writing on a first cycle may not be successful.

More specifically, in a boot-strapping technique, a redundant word line or a normal word line, when selected, is driven to a "bootstrap" voltage above the power supply voltage by special circuitry (not shown) well known in the art. Assume, for example, that a boot-strapped normal word line 12 is defective because it is shorted to ground. If the defective normal word line 12 and a redundant word line 30 are both addressed on the first (write) cycle without initialization (as described below), neither word line is enabled. The defective normal word line 12 is off because it is shorted to ground. The redundant word line 30 is off because the common internal bootstrap supply for the word line drivers is, or previously was, shorted to ground through the defective normal word line 12 that has been selected.

Operation—Initialization Required

In exemplary operation for circuit 10 incorporated into a memory device (such as a typical DRAM) where writing to a redundant element may be compromised if a defective normal element is permitted to be selected on the first write cycle, a power-up sequence is required to prepare the memory for operation. On power-up, the first power-up initialization signal on line 46 goes high, thereby initially setting all of flip-flops 20 into the set condition. When flip-flops 20 are set, their respective Q outputs are all high, thus enabling all the respective normal decoders 14. The first power-up initialization signal then terminates, after which the second power-up initialization signal is enabled high. With the second power-up initialization signal high, an oscillator and a row address counter (not shown) sequentially provide all the possible row addresses. If the IC device is a DRAM with a built-in refresh counter, this refresh counter can provide the required addresses. All of the addresses available on row address bus 18 are sequentially addressed (e.g., address row "000 . . . 000," address row "000 . . . 001," address row "000 . . . 010," et seq.). Any sequence of addresses is acceptable. As each row is initially addressed, the output signal of its corresponding normal decoder 14 is low. If no redundant decoder is programmed to this address, redundant select line 45 remains low and flip-flop 20 is not reset. On the other hand, during this initialization sequence, if the value of the redundant select signal on line 45 is high for some address (thus indicating that a redundant word line 30 has been selected to replace the relevant normal word line 12 at that address), both inputs to NAND gate 50 for that address only are simultaneously high, and the respective flip-flop 20 is reset, thereby permanently disabling the normal word line 12 for that address.

In one embodiment, if the IC device into which circuit 10 is incorporated has multiple memory arrays, the sequential addressing described above can be performed separately and in sequence, one array after the other. That is, the addressing sequence is first performed in the first memory array. When the sequence has been completed in the first array, sequential addressing is then performed in the second memory array. When the sequence has been completed in the second array, sequential addressing occurs in the third memory array, and so on. If each memory array has, for example, 512 normal word lines 12, any of which can be replaced individually with a redundant word line 30, then a sequence of 512 addresses are required to reset whichever flip-flops 20 serve respective defective normal word lines 12. A large memory device may perhaps contain 64 separate memory arrays, each having 512 normal word lines 12. The respective flip-flops 20 for these normal word lines 12 could be reset as necessary in 64 separate sequences of 512 address operations each for a total of 32,768 operations. If these address operations are performed one after the other, a relatively long time would be required.

Preferably, however, for an IC device into which circuit 10 is incorporated, the time for initialization should be minimized. Accordingly, in a preferred embodiment, for an IC device having multiple memory arrays, the sequential addressing described herein is performed concurrently in every memory array. The simultaneous selection of every memory array is achieved by placing a high level on the second power-up initialization signal (appearing on line 28), which is then inverted by inverter 60, and input into NAND gate 58. This causes the output of NAND gate 58 to go high, thereby simultaneously enabling all array select signals on lines 16 (with a separate line 16 in each array). Each array has its own redundant select signal which resets whichever flip-flops 20 are associated with defective normal word lines 12 in that array. Thus, with regard to the example given above in which a memory device comprises 64 separate memory arrays, each having 512 normal word lines 12, the total time for initialization of the memory device would be that required to perform 512 address operations. Accordingly, by performing the address sequencing in all arrays simultaneously, there is a significant decrease in the time required for initialization.

As an example of simultaneous sequencing, at the start, word line "0" in each of the 64 memory arrays is addressed. If the normal word lines 12 corresponding to the address of "0" in all but the fourth memory array are functioning properly, the respective flip-flops 20 are not reset. Word line "0" of the fourth memory array is defective, and hence, its flip-flop 20 is reset, thereby disabling that word line for all future operations. Next, word line "1" in each of the 64 memory arrays is addressed. If none of the normal word lines 12 corresponding to the address of "1" in any of the memory arrays is defective, none of the respective flip-flops 20 are reset. Next, word line "2" in each of the memory arrays is addressed. If the normal word lines 12 corresponding to the address of "2" in the eighth, twenty-fifth, and forty-second memory arrays are defective, the respective flip-flops 20 are simultaneously reset to disable these normal word lines. Such addressing continues until 512 addressing operations have been performed, during which the appropriate flip-flops 20 are reset to disable any defective normal word lines 12 in each of the 64 memory arrays.

In general, the address sequencing described herein can be performed simultaneously in a subset of all memory arrays of an IC device, wherein such subset includes more than a single array but less than all arrays.

In an alternative embodiment, sequencing is performed on the basis of programmable redundant decoders 32. Specifically, circuitry is provided to allow each programmable redundant decoder 32, if programmed, to place its programmed address onto row address bus 18 during an initialization sequence. For example, assume each array includes four programmable redundant decoders 32—which may be referred to as Decoder A, Decoder B, Decoder C, and Decoder D. In a first cycle, Decoder A is interrogated. If decoder A has been programmed, it places its programmed address on row address bus 18 and enables redundant select line 45, thereby resetting the respective flip-flop 20 for that particular address. In a second cycle, Decoder B is interrogated, and if it has been programmed, outputs its programmed address on row address bus 18 and enables redundant select line 45. This resets the respective flip-flop 20 for the programmed address of Decoder B. Likewise, in a third and a fourth cycle, if Decoder C and Decoder D have been programmed, the respective flip-flops 20 for such programmed addresses are reset. Thus, in a total of four cycles, all flip-flops 20 that need to be reset, have been reset. Essentially, instead of cycling through all possible addresses, only those addresses corresponding to flip-flops 20 which need to be reset are put on address bus 18. Such addresses are provided by redundant decoders 32 which have been programmed.

Referring again to the sequencing of the word line addresses for all arrays simultaneously in an IC device, during this sequencing, normal word lines 12 and redundant word lines 30, if allowed to turn on, would consume large amounts of power. That is, if one word line from each of perhaps 64 arrays were to be enabled simultaneously, the power consumption may be excessive. It is thus desirable to temporarily disable normal word lines 12 and redundant word lines 30 during this initialization sequence so that they are not responsive to the corresponding decoders 14 and 32, thereby reducing power dissipation and excessive current.

In a preferred embodiment, normal word lines 12 and redundant word lines 30 are disabled during the initialization period using NOR gates 22 and 34, respectively. Specifically, each NOR gate 22, when the second power-up initialization signal is high, disables its respective normal word line 12. Likewise, each NOR gate 34, when second power-up initialization signal is high, disables its respective redundant word line 30. Even though word lines 12 and 30 are disabled, with the placement of NOR gates 22 and 34 after the logic of respective normal decoders 14 and programmable redundant decoders 32, decoders 14 and 32 are still able to function so that flip-flops 20 can be reset during the initialization period. In particular, a high value for second power-up initialization signal on line 28 causes the output signal of each NOR gate 22 (and 34) to be low, which, after buffering in inverters 24 and 26 (and 36 and 38), prevents the respective normal and redundant word lines 12 and 30 from turning on, while decoders 14 and 32 still function normally. In this way, both normal word lines 12 and redundant word lines 30 do not consume power while flip-flops 20 are being reset (if appropriate).

Thus, in the preferred embodiment, NAND gate 58 selects all memory arrays simultaneously in the IC device so that the decoders within these arrays are responsive to the sequential addressing to reset the flip flops as appropriate, but at the same time NOR gates 22 and 34 disable the normal and redundant word lines so that the word lines do not consume power.

After initialization, and before the first write or read cycle of the IC device, all of the appropriate flip-flops 20 are reset to disable any defective normal word lines 12. Thus, the first time that a defective normal word line 12 is addressed, only the redundant word line 30 which replaces that defective normal word line will respond. The defective normal element will not interfere with the operation of the IC device.

Operation—Initialization Not Required

In exemplary operation for circuit 10 incorporated into an IC device (such as a typical SRAM) in which a write operation is not compromised by the selection of a defective normal element along with a redundant element, the initialization sequence described above is not required. For such an IC device, the first useful cycle for any normal word line 12 corresponds to a write cycle, because meaningful data cannot be read from any read-write memory unless it was previously written.

More specifically, if a normal word line 12 is defective, the respective normal decoder 14 and a programmable redundant decoder 32 each outputs a low value the first time that such defective normal word line 12 is addressed. The low output signal from the programmable redundant decoder 32 causes the series connected NAND gate 40 to output a high value, inverter 42 to output a low value, and inverter 44 to output a high value for the redundant select signal. The high redundant select signal on line 45 and the low output signal from the respective normal decoder 14, inverted by inverter 48, provides simultaneous high input values to both inputs of NAND gate 50. Thus, NAND gate 50 outputs a low value, inverter 52 outputs a high value, and the corresponding flip-flop 20 is reset, thereby disabling the defective normal word line 12 during the first cycle. The defective normal word line 12 is momentarily on during this first cycle, but writing to a memory cell served by the redundant word line 30 proceeds normally. After the first (write) cycle, the defective normal word line 12 remains unselected and cannot interfere with the future operation of the memory device. Thus, the first cycle for a normal word line 12, which should be a write cycle, disables that word line 12. Afterwards, when the same defective normal word line 12 is addressed for its first read, the respective flip-flop 20 is already reset to disable that normal word line. Accordingly, the power-up/initialization sequence previously described is not required for any device where the selection of a defective normal element on the first write cycle does not compromise the writing to a selected redundant element. On power-up, however, provision is still made to initialize all flip-flops 20 to the set condition.

It should be understood that circuit 10 and its operation as described above are merely exemplary of the present invention and that numerous other embodiments and implementations are within the teachings of the invention. For example, in another embodiment, flip-flops 20 can be made asymmetric or unbalanced in such a way that the flop-flops come up in the set state when powering up. This would eliminate the need for a first initialization sequence. Furthermore, the functionality of the various logic gates (e.g., NAND, NOR, and inverter) in the arrangement of FIG. 1 can be readily implemented with alternative logic gates structured in a similar or different arrangement using basic principles of logic operations.

A technical advantage of the present invention includes providing flip-flops 20 for disabling respective normal word lines 12. Generally, with flip-flops 20, defective normal elements can be effectively disabled without encountering the problems associated with previously developed techniques for disabling defective elements. Specifically, these flip-flops 20 and associated circuitry (e.g., NAND gates 50, inverters 48, inverters 52, first and second power up initialization signals 46 and 28, and redundant select line 45) are relatively small. With flip-flops 20, fuses are not needed to "de-program" any defective normal word lines 12. In addition, flip-flops 20 and the associated circuitry do not require a significant amount of wiring for support. Accordingly, the present invention can be implemented in a relatively small chip area and avoids complex wiring schemes. Furthermore, disabling of a defective normal word line 12 with a corresponding flip-flop 20 avoids the "race" problem characteristic of some prior art techniques.

Although the present invention and its advantages have been described in detail, it should be understood that various changes, substitutions, and alterations can be made therein without departing from the spirit and scope of the invention as defined by the appended claims.

What is claimed is:

1. A circuit comprising:
   a normal decoder for selecting a normal element in response to a respective address; and
   a flip-flop associated with and coupled to the normal decoder, wherein a first state of the flip-flop enables the normal decoder to respond to the respective address and a second state of the flip-flop disables the normal decoder from responding to any address.

2. The circuit of claim 1 wherein the flip-flop is asymmetrically formed so that the flip-flop powers up in the first state.

3. The circuit of claim 1 further comprising a first power-up initialization line connected to an input lead of the flip-flop, the first power-up initialization line carrying a first power-up initialization signal for setting the flip-flop to the first state on application of power to the circuit.

4. The circuit of claim 1 further comprising a reset circuitry connected to an input lead of the flip-flop, the reset circuitry for setting the flip-flop to the second state.

5. The circuit of claim 4 further comprising a redundant decoder for selecting a redundant element in response to the respective address, and wherein the reset circuitry sets the flip-flop to the second state in response to the normal decoder and the redundant decoder both responding to the respective address.

6. The circuit of claim 4 wherein the reset circuitry sets the flip-flop to the second state in response to a first write cycle for the normal element.

7. The circuit of claim 1 wherein the flip-flop comprises a set-reset flip-flop.

8. The circuit of claim 1 wherein the flip-flop is initially set to the first state during an initialization routine.

9. The circuit of claim 1 wherein the flip-flop is set to the second state by a first addressing of the normal element.

10. A method comprising:
enabling a normal decoder with a flip-flop associated with the normal decoder in a first state so that the normal decoder is responsive to a respective address; and
disabling the normal decoder with the flip-flop in a second state so that the normal decoder is incapable of responding to any address.

11. The method of claim 10 wherein enabling comprises setting the flip-flop to the first state on application of power.

12. The method of claim 10 wherein disabling comprises setting the flip-flop to the second state in response to the normal decoder and a redundant decoder both responding to the respective address.

13. The method of claim 10 wherein disabling comprises setting the flip-flop to the second state in response to a first write cycle for the normal decoder.

14. A circuit comprising:
a normal decoder for selecting a normal element in response to a respective address;
a redundant decoder for selecting a redundant element in response to the respective address if the normal element is defective; and
a flip-flop associated with the normal decoder and coupled between the redundant decoder and the normal decoder, the flip-flop for disabling the normal decoder in response to the selection of the redundant element by the redundant decoder.

15. The circuit of claim 14 wherein the flip-flop Comprises a set-reset flip-flop.

16. The circuit of claim 15 wherein the set-reset flip-flop is set during an initialization routine for the circuit.

17. The circuit of claim 15 wherein the set-reset flip-flop is asymmetrically formed so that the flip-flop powers up in a set state.

18. The circuit of claim 15 wherein the set-reset flip-flop is reset by a first addressing of the normal element.

19. An integrated circuit device comprising:
a plurality of normal elements, each normal element identified by a respective address;
a plurality of redundant elements each of which can be enabled if any of the normal elements is defective;
a plurality of normal decoders, each normal decoder coupled to at least one corresponding normal element, each normal decoder for selecting the corresponding normal element;
a plurality of redundant decoders, each redundant decoder coupled to at least one corresponding redundant element, each redundant decoder for selecting the corresponding redundant element; and
a plurality of flip-flops, each flip-flop coupled to at least one corresponding normal decoder, wherein a first state of each flip-flop enables the corresponding normal decoder to respond to the respective address for the corresponding normal element and a second state of each flip-flop disables the corresponding normal decoder from responding to any address.

20. The integrated circuit device of claim 19 wherein each of the flip-flops is initially set to the first state during an initialization routine.

21. The integrated circuit device of claim 19 wherein each of the normal elements is sequentially addressed during an initialization routine.

22. The integrated circuit device of claim 19 wherein the plurality of normal elements are organized into a plurality of arrays, each array comprising at least two normal elements.

23. The integrated circuit device of claim 22 further comprising circuitry operable to enable at least two arrays simultaneously during an initialization routine and to sequentially address the normal elements within each enabled array simultaneously during the initialization routine.

24. The integrated circuit device of claim 23 further comprising circuitry to prevent the normal elements within each enabled array from turning on during the initialization routine.

25. The integrated circuit device of claim 22 wherein at least a portion of the flip-flops can be set to the second state as each of the normal elements is sequentially addressed.

26. The integrated circuit device of claim 19 wherein any one of the flip-flops is set to the second state in response to a corresponding normal decoder and one of the redundant decoders both responding to the respective address for the corresponding normal element.

27. The integrated circuit device of claim 19 wherein:
each of the flip-flops is set to the first state using a first power-up initialization signal; and
at least a portion of the flip-flops can be set to the second state using a second power-up initialization signal.

28. A method comprising:
selecting a redundant element to replace a normal element if the normal element is defective; and
disabling the normal element with a flip-flop associated with the normal element in response to the selection of the redundant element.

29. The method of claim 28 wherein disabling comprises resetting the flip-flop.

30. The method of claim 28 further comprising setting the flip-flop during an initialization routine.

31. The method of claim 30 further comprising setting the flip-flop by a first addressing of the normal element.

32. A method comprising:
providing a plurality of normal decoders, each normal decoder for selecting a respective normal element in response to a respective address; and
enabling each of the normal decoders with a respective flip-flop in a first state so that the normal decoders are each responsive to the respective address.

33. The method of claim 32 further comprising:
programming a redundant element with an address; and
resetting the flip-flop associated with the programmed address to disable the respective normal decoder.

34. The method of claim 33 wherein the step of resetting comprises simultaneously selecting the normal decoder to be disabled and a redundant decoder associated with the redundant element.

35. The method of claim 32 further comprising sequentially addressing each of the normal elements during an initialization routine.

36. The method of claim 33 wherein at least a portion of the flip-flops are set to the second state during sequential addressing.

37. A method comprising:
   providing a plurality of normal decoders and a plurality of normal elements, each normal decoder associated with a separate normal element, the plurality of normal decoders and normal elements organized into a plurality of arrays, wherein within each array each normal decoder is operable to select the associated normal element in response to a respective address; and
   enabling each of the normal decoders with a respective flip-flop in a first state so that the normal decoders are each responsive to the respective address.

38. The method of claim 37 further comprising:
   enabling at least two arrays simultaneously during an initialization routine; and
   sequentially addressing the normal elements within each enabled array simultaneously during the initialization routine.

39. The method of claim 38 further comprising preventing the normal elements within each enabled array from turning on during the initialization routine.

* * * * *